United States Patent [19]

Cain

[11] Patent Number: 5,656,945
[45] Date of Patent: Aug. 12, 1997

[54] APPARATUS FOR TESTING A NONPACKAGED DIE

[75] Inventor: Earl S. Cain, Napa, Calif.

[73] Assignee: Tribotech, Napa, Calif.

[21] Appl. No.: 60,614

[22] Filed: May 12, 1993

[51] Int. Cl.$^6$ ................................................. G01R 31/02
[52] U.S. Cl. ........................................ 324/765; 324/755
[58] Field of Search .................................. 324/750, 754, 324/765, 755; 437/8; 257/40, 48; 439/66, 70

[56] References Cited

U.S. PATENT DOCUMENTS

| | | | |
|---|---|---|---|
| 4,340,858 | 7/1982 | Malloy | 324/72.5 |
| 4,597,617 | 7/1986 | Enochs | 361/398 |
| 4,766,371 | 8/1988 | Moriya | 439/66 |
| 4,899,107 | 2/1990 | Corbett et al. | 324/158 |
| 5,027,062 | 6/1991 | Dugan et al. | 324/754 |
| 5,123,850 | 6/1992 | Elder et al. | 324/158.1 |
| 5,140,405 | 8/1992 | King et al. | 357/72 |
| 5,177,439 | 1/1993 | Liu et al. | 324/754 |
| 5,225,037 | 7/1993 | Elder et al. | 324/754 |
| 5,302,891 | 4/1994 | Wood et al. | 324/765 |
| 5,336,649 | 8/1994 | Kinsman et al. | 437/8 |
| 5,336,992 | 8/1994 | Saito et al. | 324/754 |
| 5,389,885 | 2/1995 | Swart | 324/754 |

OTHER PUBLICATIONS

K. J. Puttlitz, K. Lidestri, "Replacing Flip Chips On MLC Multichip Modules Using Focused Infrared (IR): The Basics," *ISHM '92 Proceedings*, pp. 384–390 (no date available).

Tom Powell, Dudley Gage, "Military multichip modules need 'perfect' die," *Electronic Products*, Oct. 1992, pp. 41–51.

"New Frontiers; For Goodness' Sake," *Circuits Assembly*, Jul., 1993, pp. 14, 16, 21.

"Motorola Hikes Bare Die For Multichip Modules," *Electronic News*, vol. 18, Jun. 14, 1993.

Jack Robertson and Stuart Zipper, "Bare Dies Planned for MCMs," *Electronic News*, Apr. 26, 1993.

Thomas A. Williams, "Securing Known Good Die; Experts Define the Challenges," *Advanced Packaging*, Fall 1992, pp. 49, 50, 52, 54–59 (no month available).

Don Richmond, "Micro SMT Discrete Device Technical White Paper," *Micro SMT, Inc.*, Apr. 25, 1993.

Dan Romanchik, "Why Burn–In ICs?; Simply put, burn–in accelerates the processes that cause ICs to fail," *Test & Measurement World*, Oct., 1992.

Jack Robertson, "IC Makers Water Down Multichip Die Proposal," *Electronic News*, Dec. 7, 1992.

*Primary Examiner*—Vinh P. Nguyen
*Attorney, Agent, or Firm*—Flehr Hohbach Test Albritton & Herbert LLP

[57] ABSTRACT

A method for testing an integrated circuit die having interconnect pads in a package having leads in a configuration compatible with test, burn-in and handling equipment. The method includes the steps of placing the interconnect pads in direct contact with the leads of the package without forming a permanent connection to the interconnect pads, conducting burn-in tests on the die, electrically testing the integrated circuit of the die and disconnecting the interconnect pads from the leads of the package. In a preferred approach, the die is placed in the package and a nonpermanent pressure contact is made with each of the interconnect pads. In another aspect of the invention, a fixture is provided for making temporary electrical connections with an integrated circuit die having interconnect pads arranged in a predetermined pattern. The fixture includes contact elements carried by a substantially rigid support member in a pattern corresponding to the predetermined pattern of interconnect pads and adapted to engage a single die. An engagement assembly is provided for bringing the interconnect pads and the contact elements together to make nonpermanent temporary simultaneous electrical connections therebetween. The engagement assembly includes a package having leads in a configuration compatible with test, burn-in and handling equipment for conventional integrated circuit packages.

19 Claims, 6 Drawing Sheets

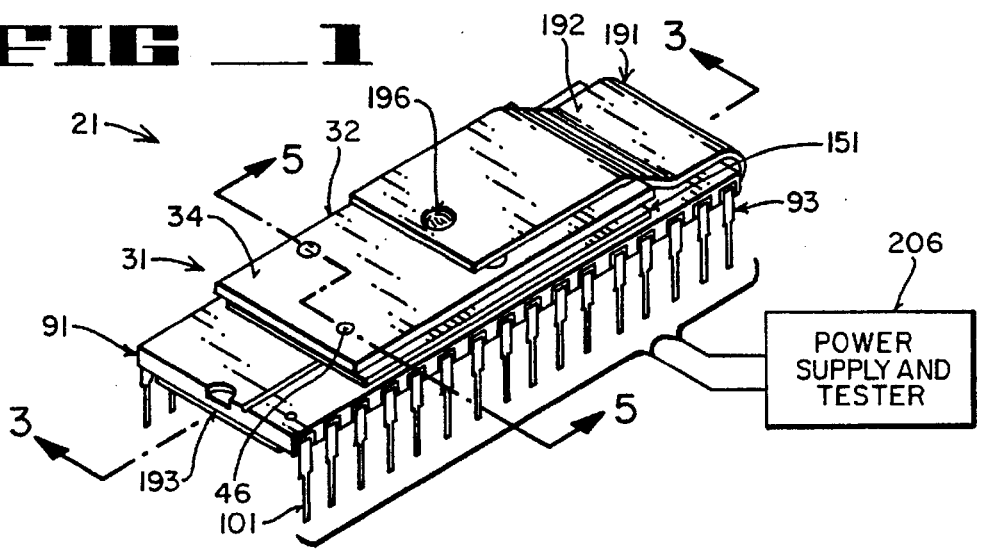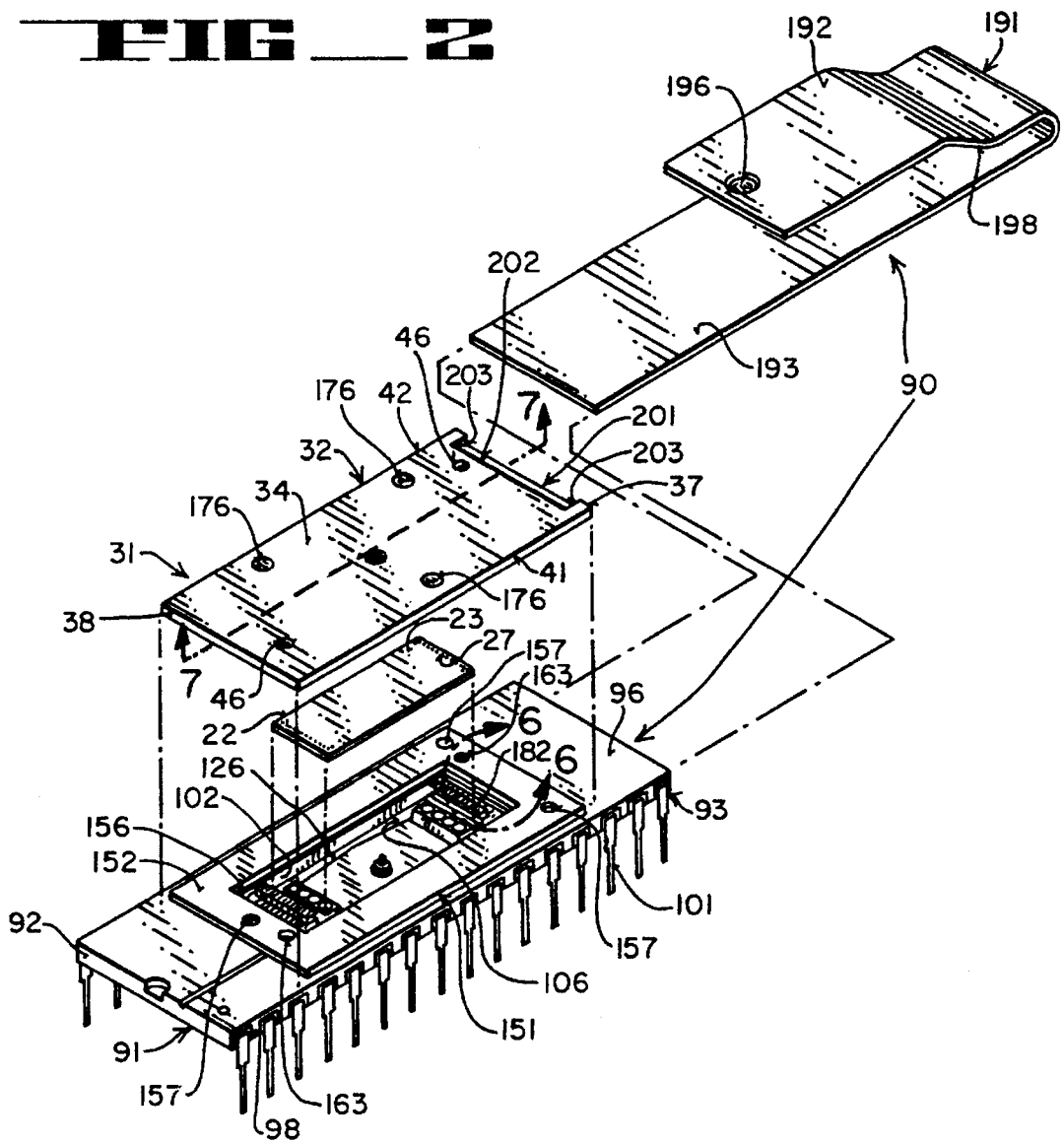

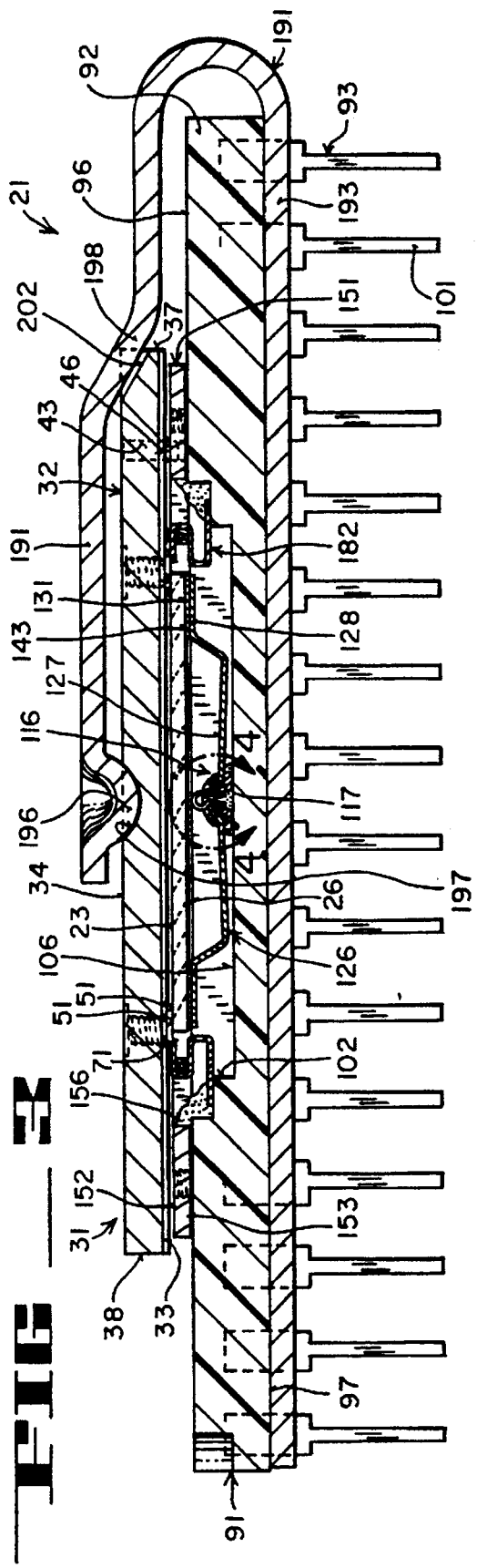
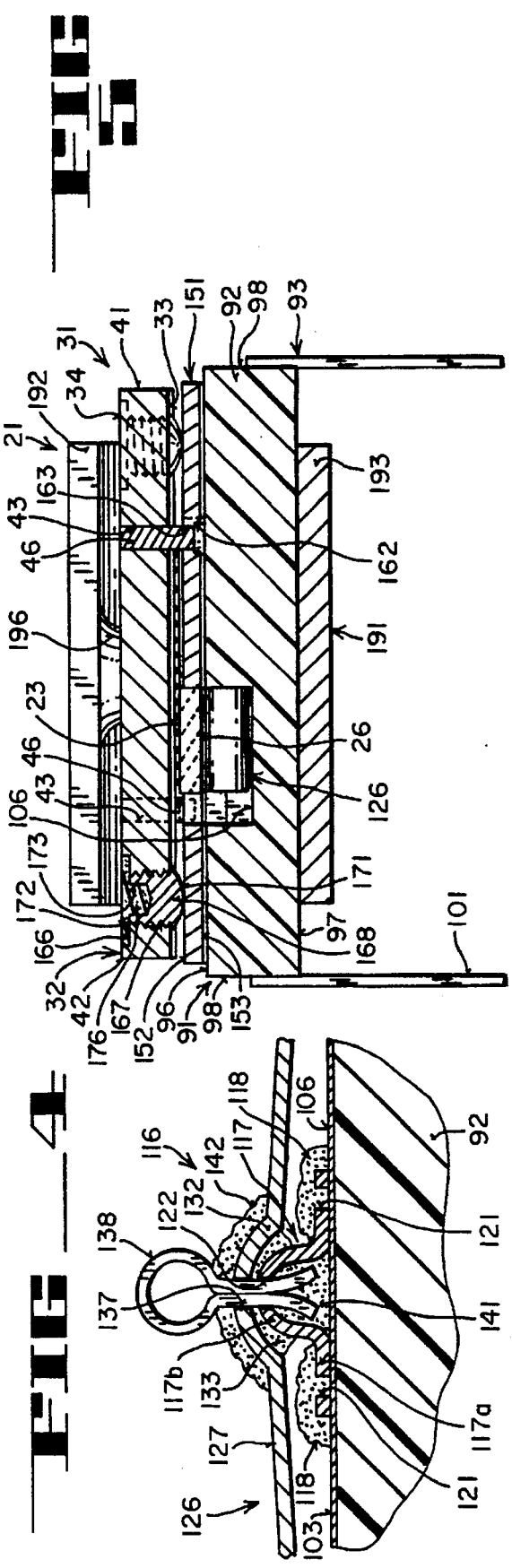

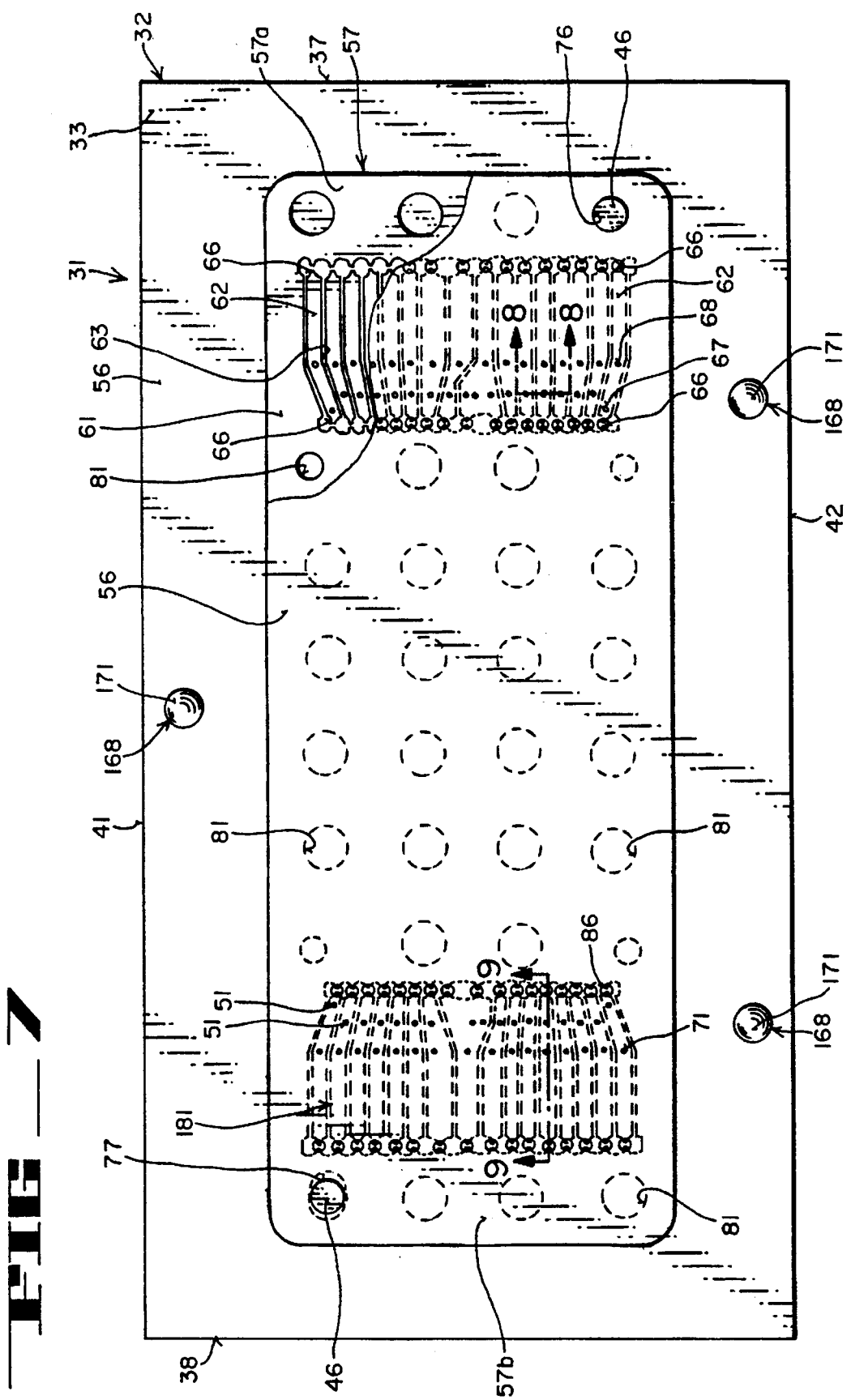

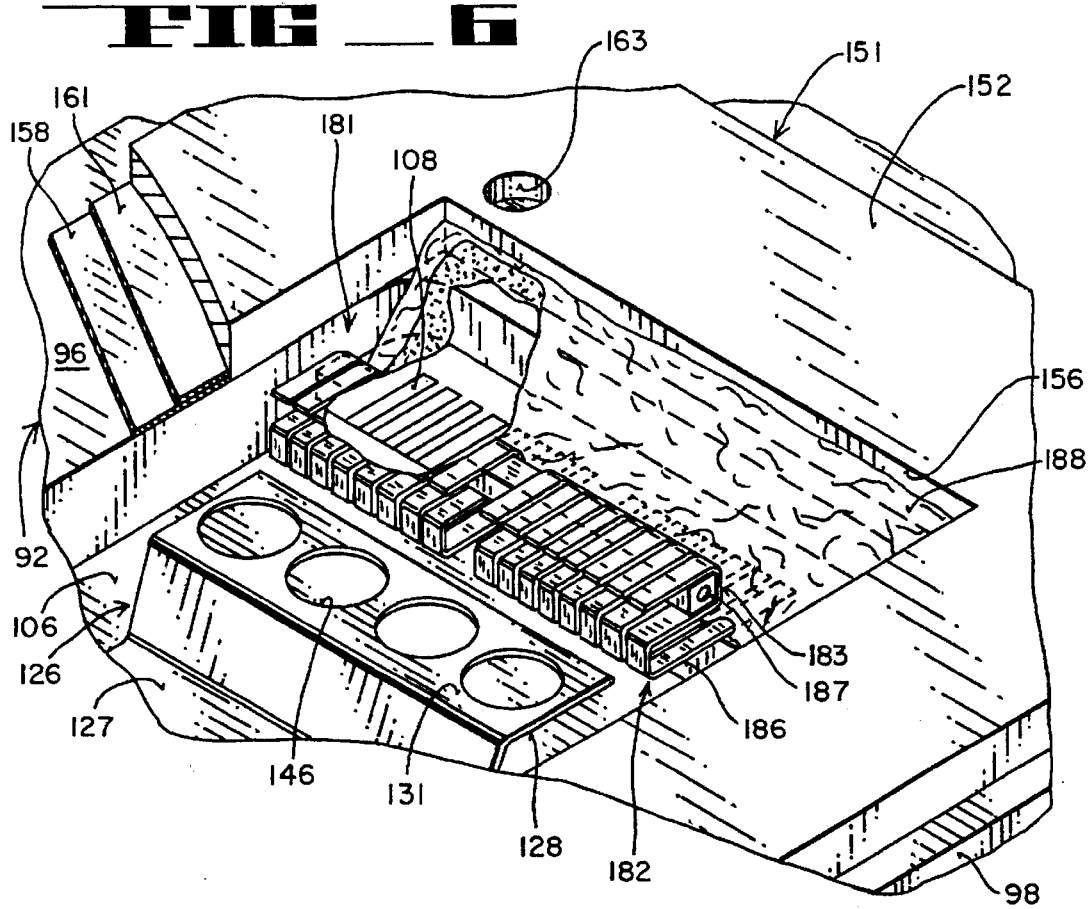
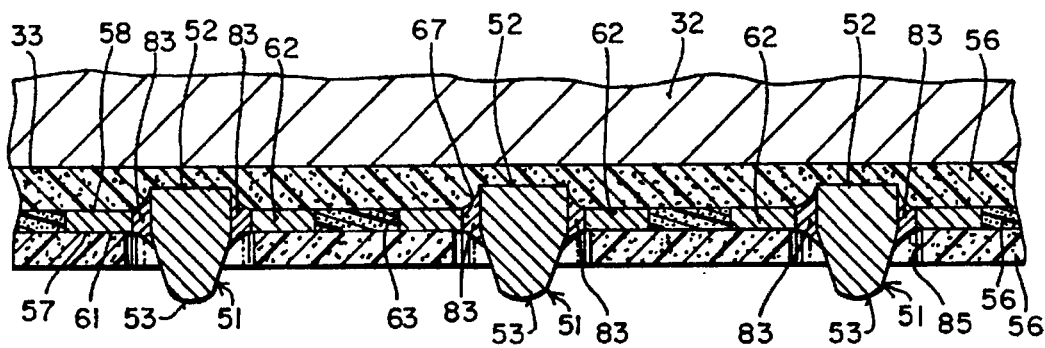
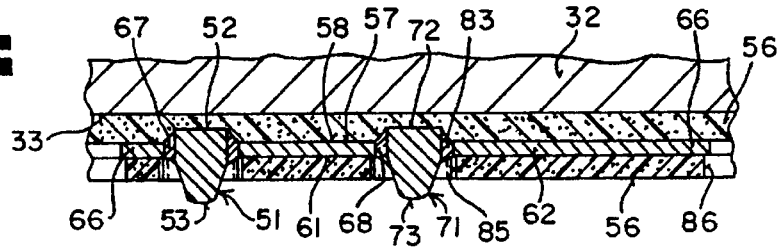

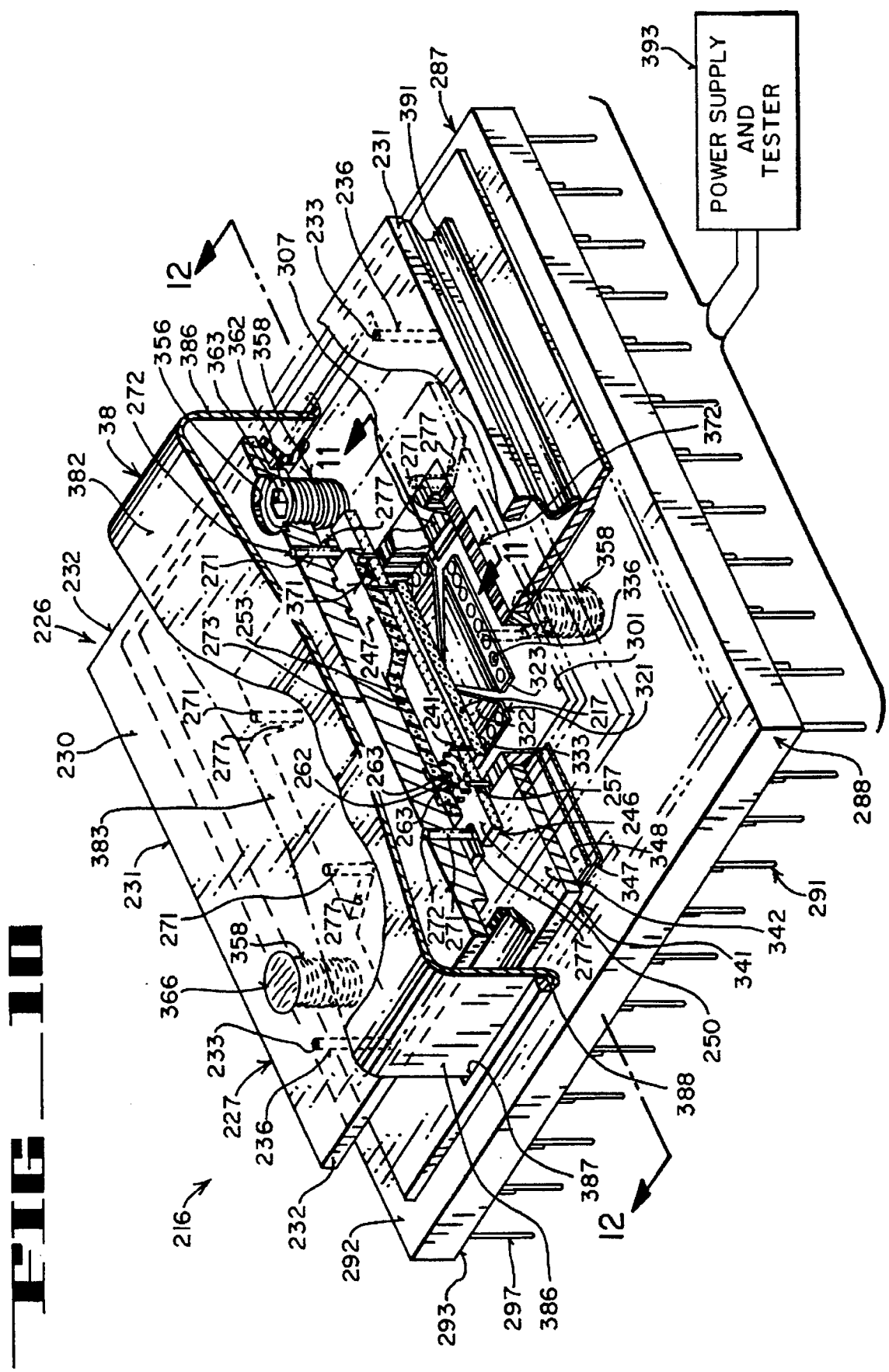

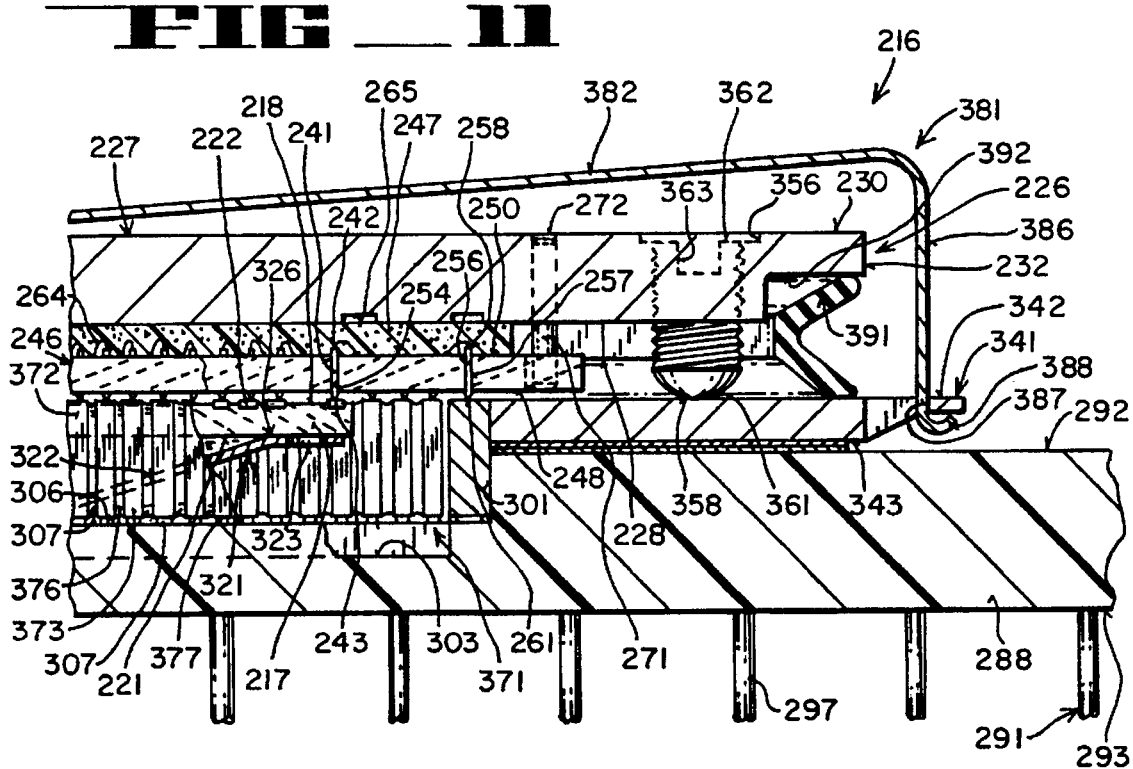
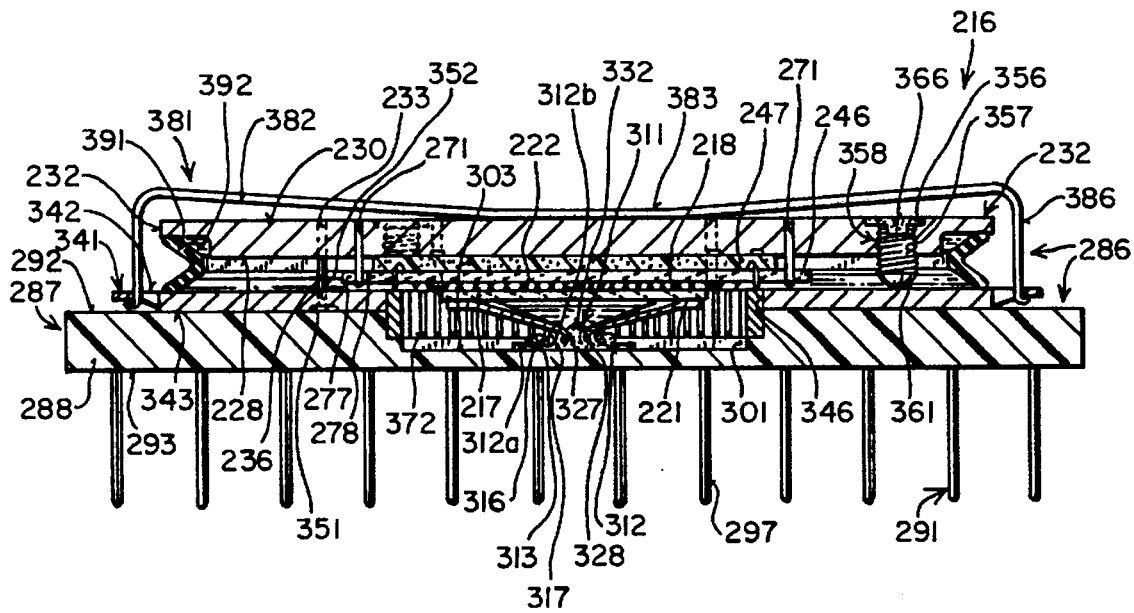

APPARATUS FOR TESTING A NONPACKAGED DIE

BRIEF DESCRIPTION OF THE INVENTION

This invention relates to the testing of electrical devices and, more particularly, to the testing of nonpackaged integrated circuit dice.

BACKGROUND OF THE INVENTION

An integrated circuit die is subject to a series of tests to ensure that it can operate within the desired parameters. A die which passes these tests is referred to as a known good die (KGD). Dice are manufactured in lots on wafers. Each die is initially probe tested while still on the wafer. Wafer level testing is usually limited to testing for continuity and resistance and sometimes for capacitance and/or inductance. The die typically cannot be statically or dynamically tested under environmental conditions while still on the wafer. Difficulties with access and thermal expansion have presented problems in providing power, ground and signals into and out of a die in the middle of a wafer. For example, testing of a die under power while still on the wafer can cause thermal damage to the other dice on the wafer. As a result, most dice are not further tested prior to sorting. Preferably, a die sliced from the wafer which has passed the probe test is thereafter subject to environmental functional and climatic burn-in testing to make certain that it operates properly under conditions which approximate the worst that it can expect to experience during use.

The burn-in tests involve pre-exposing the dice to anticipated functional and climatic environmental conditions so as to sort out infant mortality and marginal responsive chips. The scope and exposure can include testing for any or all of temperature, time or voltage. Temperature testing can include testing the chip at low (down to −65 degrees Centigrade), ambient (approximately 20 degrees Centigrade) and/or high (up to 175 degrees Centigrade) temperatures. Testing for time can include on-off testing and/or duration testing, for example 24, 48 or 168 hours. Voltage testing can include zero or continuity testing, static testing for power, ground and/or signal levels, dynamic testing for partial or full range performance and testing at greater than specification levels for accelerated stress. In this regard, typical die may be subjected to shock forces, biasing, continuity checks, voltage signal cycling, power surges and high-current thermal shock during burn-in testing.

Currently, most dice are mounted to a package to permit electrical access to the individual die. Although the package can have many different designs, a first level package such as a lead frame package having one of the several standard or conventional lead or pin configurations adopted by the semiconductor industry is typically used. As a result, most test, burn-in, transferring and handling equipment is designed to accommodate only die packages having input and output leads or pins arranged in one of these standard configurations. This standardization not only reduces compatibility problems between packages and circuit boards, but also between packages and test, burn-in, handling and transferring equipment. A die mounted in a nonstandard die package or support structure typically requires costly specialized machinery for testing, burn-in, transferring and/or handling.

Standard single chip packages include the dual inline package (DIP), the pin grid array package (PGA), the quad flat package (QFP), leaded chip carrier, low lead count metal can package, small outline integrated circuit package (SOIC), ball grid array package (BGA) and metal pin grid array package (MQUAD). The dual inline and pin grid array packages are through hole packages having pins or leads for mounting in a socket or hole in the second level package; the quad flat package is a surface mounted package having leads or pads meant for surface mounting to the second level package.

Mounting a die within a package typically involves attaching the die within a socket formed in the package by die bonding with a suitable medium such as epoxy or filled polymer. The interconnect or wire bond pads of the die are electrically connected to the package leads with electrical interconnects permanently attached to the wire bond pads such as by wire bonding, lead bonding or soldering. A lid is usually mounted, often by soldering, over the socket once the die has been attached therein. Once burn-in has been completed, the lid is desoldered to permit access to the die. If the die does not perform properly under the burn-in tests, the die and package are usually discarded. Although methods exist for salvaging packages for reuse, these methods have not usually proven cost effective.

Apparatus or fixtures have been provided for performing burn-in testing on discrete nonpackaged dice. Some of these fixtures are designed to make electrical connections with the integrated circuit of the dice without forming a permanent connection to the wire bond pads. For example, see the apparatus disclosed in U.S. Pat. No. 4,899,107. These apparatus and fixtures, however, have a variety of disadvantageous. For example, the nonstandard test apparatus disclosed in U.S. Pat. No. 4,899,107 requires specialized machinery for use therewith and has not proven altogether satisfactory in operation. In addition, low force nonpermanent connections to wire bond pads have been found to be difficult by the fact that most bond pads cannot withstand a large pressure thereon without disfiguring the bond pad surface so as to impair subsequent wire bonding or without causing subsurface metallization damage.

Other test fixtures require that deleterious bonds of a permanent nature be made to the interconnect pads, or have proven too complicated to manufacture and/or operate. Still other fixtures have been designed for the burn-in testing of dice and include probes and leads etched from one or more films or layers of conductive material deposited onto an elastomeric layer or film mounted to a rigid support plate or other structure. The probes are pressed against the wire bond pads of the die to establish electrical contact with the die to permit testing thereof. These fixtures suffer from difficulties in piercing through the aluminum oxide layer on aluminum wire bond pads to establish electrical contact therewith and excessive loads exerted on the wire bond pads. Similar fixtures suffering from similar disadvantages have probes mounted to a first structure which is compliantly mounted to a second structure.

Certain integrated circuit dice, such as flip chips, are designed for direct placement on a circuit board, substrate or other first or second level package. The interconnect pads on flip chips are aligned on one surface so as to mate with the bond pads on the substrate or circuit board when the chip is flipped over and placed face down. The interconnect pads on the chip or die consist of bond pads provided with drops of solder known as solder bumps which serve to bond the die and substrate pads together.

As with other chips having conventional bond pads, it has proven difficult to make effective electrical contact with a flip chip in an isolated environment, that is apart from a circuit board. Among other things, this is due to the fact that the tolerances for solder bumps are not as small as those for conventional wire bond pads. For these and other reasons, burn-in tests are typically not performed on flip chips. As can be appreciated, the inability to economically and effectively burn-in test flip chips can increase the percentage of defective chips shipped.

OBJECTS AND SUMMARY OF THE INVENTION

In general, it is an object of the present invention to provide a method for performing burn-in tests on a non-packaged integrated circuit die which utilizes, for the most part, conventional and available testers, handlers and materials.

Another object of the invention is to provide a damage-free method such as described above for testing an integrated circuit die without forming a permanent connection with the interconnect pads of the die.

Another object of the invention is to provide a method such as described above for testing an integrated circuit die having 20 to 1,000 or more interconnect pads disposed on the surface thereof.

Another object of the invention is to provide a method such as described above for testing flip chips having interconnect pads which include solder bumps.

Another object of the invention is to provide a fixture for use with the method described above which utilizes a package compatible with commercial test, burn-in and handling equipment for conventional integrated circuit packages.

Another object of the invention is to provide a fixture of the above character which utilizes a conventional or industry standard package assembly having the usual envelope and commercial standard electrical access. Another object of the invention is to provide a fixture of the above character in which a controlled low pressure contact is made independently with each interconnect pad when establishing electrical contact therewith.

Another object of the invention is to provide a fixture of the above character in which the pressure exerted-on the interconnect pads is not deleterious to the integrated circuit die or subsequent interconnection operations, but leaves a small witness mark on the interconnect pad as evidence that the die has undergone testing and/or burn-in.

Another object of the invention is to provide a fixture of the above character in which the pressure exerted on each of the interconnect pads is substantially equal.

Another object of the invention is to provide a fixture of the above character in which the electrical contact with the interconnect pads is maintained should the die expand during thermal testing.

These and other objects are achieved in accordance with the invention by providing a method for testing an integrated circuit die in a package. The die has interconnect pads which permit making electrical connections with the die, and the package has leads which permit making electrical connections with the package and are in a configuration compatible with test, burn-in and handling equipment. The method includes the steps of placing the interconnect pads in direct contact with the leads of the package without forming a permanent connection to the interconnect pads, conducting burn-in tests on the die while the interconnect pads are in direct contact with the leads of the package, electrically testing the integrated circuit of the die to ascertain whether predetermined electrical parameters are met and disconnecting the interconnect pads from the leads of the package. In a preferred approach, the die is placed in the package and a pressure contact is made with each of the interconnect pads to permit directly connecting them to the leads of the package.

A fixture is provided for making temporary electrical connections with an integrated circuit die to permit electrical testing of various parameters of the circuitry of the integrated circuit. The die has interconnect pads arranged in a predetermined pattern. The fixture includes a substantially rigid support member and contact elements carried thereby. The contact elements are adapted to engage a single die and have a pattern corresponding to the predetermined pattern of interconnect pads. Engagement means is provided for bringing the interconnect pads and the contact elements carried by the support member together into engagement and registration to make nonpermanent temporary simultaneous electrical connections therebetween. The engagement means includes a package having leads which permit making electrical connections with the package and are in a configuration compatible with test, burn-in and handling equipment for conventional integrated circuit packages. The fixture further includes lead means connected to the contact elements carried by the support member and making electrical contact with the leads of the package.

In the preferred embodiments, a yieldable material at least partially encapsulates the contact elements and, by doing so, exerts a substantially equal pressure on the contact elements and thus the interconnect pads and accommodates irregularities in the elevations of the interconnect pads. In one embodiment, a plate member having a thermal coefficient-of expansion which approximates the thermal coefficient of expansion of the die is carried by the support member. The plate member has first and second opposite surfaces and is provided with a plurality of bores extending therethrough. The contact elements are slidably disposed in the bores. Registration retention means is carried by the support member and the plate member for retaining the contact elements in registration with the interconnect pads should the die expand during thermal testing.

BRIEF DESCRIPTION OF THE DRAWINGS

FIG. 1 is an isometric view of the assembly for testing integrated circuit die of the present invention.

FIG. 2 is an exploded isometric view of the testing assembly of FIG. 1 shown with an integrated circuit die.

FIG. 3 is a cross-sectional view taken along the line 3—3 of FIG. 1.

FIG. 4 is an enlarged cross-sectional view taken along the line 4—4 of FIG. 3.

FIG. 5 is a cross-sectional view taken along the line 5—5 of FIG. 1.

FIG. 6 is an enlarged isometric view, partially cut away, taken along the line 6—6 of FIG. 2.

FIG. 7 is a bottom plan view, partially cut away, taken along the line 7—7 of FIG. 2.

FIG. 8 is a cross-sectional view taken along the line 8—8 of FIG. 7 and rotated 180 degrees.

FIG. 9 is a cross-sectional view taken along the line 9—9 of FIG. 7 and rotated 180 degrees.

FIG. 10 is an isometric view, partially cut away, of another embodiment of the assembly for testing integrated circuit die of the present invention.

FIG. 11 is a cross-sectional view taken along the line 11—11 of FIG. 10.

FIG. 12 is a cross-sectional view taken along the line 12—12 of FIG. 10.

DETAILED DESCRIPTION OF THE INVENTION

Reference will now be made in detail to the preferred embodiments of the invention, which are illustrated in the accompanying figures. Turning now to the drawings, wherein like components are designated by like reference numerals throughout the various figures, attention is first directed to FIGS. 1 through 9 where one embodiment of the apparatus and method of the present invention for testing non-packaged integrated circuit die is shown.

A fixture 21 of the present invention is designed for making temporary electrical connections with an integrated circuit die 22 to permit electrical testing of various parameters of the circuitry of the integrated circuit in the die. Die 22 is of a conventional type, being made from silicon or other semiconductor material and having opposite and generally planar top and bottom surfaces 23 and 26. Top surface 23 of die 22 has a plurality of interconnect pads or wire bond pads 27 arranged in a predetermined pattern or array along two opposite sides of the die which permit making electrical connections with the integrated circuit of die 22. Wire bond pads 27 can vary in elevational height with respect to top surface 23 from one to 25 microns.

Fixture 21 is provided with a cover or electrical bridge apparatus or assembly 31 which overlies die 22 and includes a substantially rigid and flat support member or lid 32 made of any suitable material, such as ceramic or alloy 42 metal, having a coefficient of expansion generally matching that of silicon. Lid 32 is generally rectangular when viewed in plan as in FIG. 2, having generally parallel and planar opposite first or bottom and second or top surfaces 33 and 34, opposite and parallel first and second ends 37 and 38 and opposite and parallel first and second sides 41 and 42. Two diagonally disposed bores 43 extend generally perpendicularly through surfaces 33 and 34 at opposite corners formed by adjoining side and end 42 and 37 and adjoining side 41 and end 38 and have elongate registration means or pins 46, each having a generally circular cross-section, press fit or otherwise snugly and permanently disposed therein. Registration pins 46 are generally flush with lid top surface 34 and extend from bottom surface 33 as illustrated in FIGS. 2, 3, 5 and 7.

Contact elements or pins 51 made of gold plated stainless steel or any other suitable material are carried by lid bottom surface 33 and are adapted to engage wire bond pads 27 for making electrical connections to the integrated circuit on die 22 (See FIG. 3). Pins 51 are generally circular in cross-section, having a butt first or top end 52 and tapering toward a rounded second or bottom end 53 (See FIGS. 8 and 9). Means for mounting pins 51 to lid 32 includes a suitable polymer 56 such as silicone which serves as a yieldably elastic flexible adhesive material or jelly and is disposed evenly across lid bottom surface 33 in several layers. A pattern interconnect 57 is embedded in polymer 56 and serves as means for arranging contact pins 51 on lid bottom surface 33 in a pattern corresponding to the predetermined pattern of wire bond pads 27 on die top surface 23.

Pattern interconnect 57 is a very thin and flexible sheet made of any suitable material such as gold-plated copper or alloy 42. The patterned interconnect is generally elongate and rectangular in shape when viewed in plan with first and second end portions 57a and 57b and opposite and generally parallel first or top and second or bottom surfaces 58 and 61 (See FIGS. 7 through 9). A set of thin elongate strip elements or temporary jumper connections 62 are formed in each of end portions 57a and 57b. Jumper connections 62 are generally longitudinally aligned with pattern interconnect sides 41 and 42, being spaced-apart across pattern interconnect 57 in juxtaposition with each other and separated by elongate electrical disconnect slots 63 extending through top and bottom surfaces 58 and 61. The jumper connections are joined at each end to the remainder of pattern interconnect 57 by thin connectors 66, and are provided with sets of first or inner and second or outer bores 67 and 68 extending therethrough between surfaces 58 and 61. At least one inner bore 67 and outer bore 68 is provided in each jumper connection 62. Inner bores 67 are arranged in a pattern which extends generally linearly across pattern interconnect 57 and corresponds to the predetermined pattern of wire bond pads 27 on die 22. Outer bores 68, being farther from the center of pattern interconnect 57 than inner bores 67, are also arranged in a pattern which extends generally linearly across the pattern interconnect. Inner bores 67 are designed for receiving contact pins 51 and outer bores 68 are designed for receiving a second set of contact elements or pins 71 which are substantially similar to contact pins 52 and have a butt first or top end 72 and a rounded second or bottom end 73 (see FIG. 9).

Pattern interconnect 57 is further provided with first and second alignment bores 76 and 77 extending through surfaces 58 and 61 and diagonally disposed thereon in a pattern which generally conforms with the pattern of registration pins 46 on lid 32. First alignment bore 76 is generally circular in cross-section and second alignment bore 77 is generally oblong shaped in cross-section, each such bore being configured and dimensioned to receive a registration pin 46. In addition, pattern interconnect 57 is provided with a pattern of securement bores 81 extending through top and bottom surfaces 58 and 61 to assist in retaining the pattern interconnect in polymer 56. The configuration of pattern interconnect 57, including slots 63 and bores 67, 68, 76, 77 and 81, is formed by any suitable means such as chemical etching or stamping.

For assembling cover assembly 31, contact pins 51 and 71 are mounted to pattern interconnect 57 in respective inner and outer bores 67 and 68 by any suitable means such as soldering with gold tin solder 83. Pins 51 and 71 are perpendicularly aligned with pattern interconnect surfaces 58 and 61, top ends 52 and 72 extending from top surface 58 and bottom ends 73 extending from bottom surface 61. Bottom ends 53 and 73 of pins 51 and 71 are elevationally aligned with respect to surfaces 58 and 61 within a surface planarity of 0.0005 inches.

A first or bottom layer of polymer 56 is placed on and disposed across pattern interconnect bottom surface 61, after which a second layer is placed in slots 63 and securement bores 81. A third layer of polymer 56 is placed on and disposed across pattern interconnect top surface 58. First and second sets of holes 85 and 86 are provided in the bottom layer of polymer 56. Contact pins 51 and 71 extend through first holes 85, while second holes 86 provide access to connectors 66. Further holes are provided for access to first and second alignment bores 76 and 77.

The laminate formed by polymer 56 with pattern interconnect 57 embedded therein is mounted to lid 32. More specifically, a fourth thin layer or film of polymer 56, not shown in the drawings, is applied atop the third layer of polymer 56 and serves to bond pattern interconnect 57 to lid bottom surface 33 with pattern interconnect top surface 58 facing lid bottom surface 33. Registration pins 46 are received within alignment bores 76 and 77 to ensure proper alignment of pattern interconnect 57 and lid 32, with the oblong configuration of second alignment bore 77 accommodating the variations in placement of registration bores 43 on lid 32 and alignment bores 76 and 77 on pattern interconnect 57 within the specified tolerances. Prior to mounting pattern interconnect 57 to lid 32, connectors 66, accessible through second holes 86, are each punched to sever and singulate temporary jumper connections 62 from the remainder of the pattern interconnect. Connectors 66 are shown in the drawings, specifically FIGS. 7 and 9, in their severed condition. As severed from the remainder of pattern interconnect 57, jumper connections 62 are carried by polymer 56 and serve as means for electrically connecting contact pins 51 and 71.

Engagement means or assembly 90 is provided for bringing wire bond pads 27 and contact pins 51 together into accurate engagement and registration to make nonpermanent temporary simultaneous electrical connections therebetween. Engagement assembly 90 includes a conventional standardized commercial chip package, such as dual inline package 91 shown in FIGS. 1 and 2, for receiving an integrated circuit die. Package 91 is formed from a laminate housing 92 made from a suitable non-conductive material such as ceramic and includes an integral conductive lead interconnect assembly 93 carried by housing 92 to permit making electrical contact with a die mounted in the package. Housing 92 is generally in the form of a parallelepiped, having opposite first or top and second or bottom surfaces 96 and 97 and opposite generally parallel and planar sides 98. Lead interconnect assembly 93 includes an equal number of generally parallel pins or lead strips 101 on each housing side 98 which permit making electrical connections through chip package 91. Leads 101 are aligned in a pattern so as to be spaced apart along sides 98 at substantially equal intervals and extend downwardly therefrom in a direction substantially perpendicular to housing bottom surface 97.

Housing 92 further includes a recess or socket 102 provided in the center of top surface 96. A layer of vapor deposited gold 103, included within lead interconnect assembly 93, has a surface which forms lower surface 106 of well or socket 102 and the floor of chip package 91. An integral platform 107 is formed in housing 92 at each end of socket 102 below top surface 96, each platform 107 having a plurality of contact elements or bond pads 108 linearly spaced apart therealong. Each bond pad 108 is electrically connected to a lead 91 by a conventional interconnect, not shown in the drawings, vapor deposited onto a layer of ceramic and buried within laminate ceramic housing 92. Bond pads 108 are each formed from a strip of gold vapor deposited onto platform 107 of ceramic housing 92 and, together with the related interconnects, comprise part of lead interconnect assembly 93.

Engagement assembly 90 has a mounting assembly 116 for temporarily and nonpermanently mounting die 22 within socket 102 as illustrated in FIGS. 3 through 5. Mounting assembly 116 comprises a button 117 made of gold plated copper or any other suitable material and having a base portion 117a ultrasonically bonded to well lower surface or package floor 106. Button 117 is further secured to package floor 106 by epoxy 118, and is provided with a plurality of bores 121 spaced circumferentially around the bottom thereof for increasing the surface area of button 117 and gold layer 103 interconnected by the epoxy. Two bores 121 are shown in cross-section in FIG. 4. Button 117 further includes a dome portion 117b provided with a centrally disposed bore 122 extending longitudinally therethrough.

A support structure or spring platform 126 for supporting die 22 on package 91 and made from a suitable material such as alloy 42 metal is also included within mounting assembly 116. Yieldable elastic platform 126 is generally rectangular when viewed in plan and is formed from a generally planar base 127 with an elevated pad 128 at each end thereof. Pads 123 have top surfaces 131 which are generally coplanar. Base 127 has a dimple 132 formed in the center thereof for alignably positioning and mounting platform 126 to button 117. A suitable quick-drying cyanoacrylate polymer or anaerobic cement 133 such as "Loctite" is disposed between dimple 132, which extends upwardly from base 127, and button 117. Cement 133 serves as an initial means for attaching platform 126 to button 117 with pads 128 being generally parallel with package floor 106. Dimple 132 is provided with a bore 137 therethrough, and a locking pin 138 made of any suitable material such as brass extends through dimple and dome bores 137 and 122 for further securing spring platform 126 to button 117. Locking pin 138 is retained in position by epoxy 141 disposed within button dome portion 117b and epoxy 142 disposed on dimple 132.

Die 22 is mounted on platform 126 with die bottom surface 26 being supported at each end by a platform pad 128. A suitable adhesive such as a thin tacky layer 143 of any suitable liquid or polymer such as silicone, water or vacuum oil, illustrated in FIG. 3, is placed on pad top surfaces 131 and temporarily grips die bottom surface 28 to restrict lateral movement between die 22 and platform 126 until wire bond pads 27 are engaged by bottom ends 53 of contact pins 51. As illustrated in FIG. 6, platform pads 128 are each provided with bores 126 extending therethrough and spaced thereacross to further limit such lateral movement and permit tacky layer 143 of liquid or polymer to pass therethrough when cover assembly 31 is mounted to chip package 91.

A frame 151 made of a suitable material such as alloy 42 metal is mounted to housing top surface 96 and is included in the means for positioning and aligning cover assembly 31 on chip package 91 (See FIG. 2). Frame 151 is generally rectangular when viewed in plan, having opposite and generally parallel first or top and second or bottom surfaces 152 and 153 and provided with a central rectangular opening 156 therethrough. The frame is provided with three threaded bores 157 extending through surfaces 152 and 153 which are adapted for engagement by handling and positioning equipment, not shown in the drawings, to facilitate proper mounting and positioning of frame 151 on chip package 91. Housing top surface 96 is provided with a layer 158 of vapor deposited gold around the perimeter of socket 102 and frame bottom surface 153 is attached to gold layer 158 by any suitable means such as gold tin solder 161. Frame 151 is mounted and attached to chip package 91 so that frame opening 156 is generally aligned about and not overlapping socket 102, and frame top surface 152 is generally parallel to package floor 106.

Frame 151 is further provided with two countersinks 162 extending through bottom surface 153 and two corresponding registration bores 163 extending through top surface 152 and opening into countersinks 162 (See FIGS. 1 and 5). Among other things, countersinks 162 provide a suitable area into which excess solder 161 will be restricted in registration bores 163 during attachment of frame 151 to chip package 91. Registration bores 163 are aligned on frame 151 in a precise pattern corresponding to the pattern of registration pins 46 on lid bottom surface 33, and registration pins and bores 46 and 163 are included within the means for aligning lid 32 with frame 151 and chip package 91.

Engagement assembly 90 also includes means for leveling and elevationally positioning lid 32 with respect to frame 151 and chip package 91. In this regard, lid 32 is provided with three countersinks 166 extending through top surface 34 and three corresponding threaded bores 167 extending through bottom surface 33 and opening into countersinks 166 (See FIGS. 1 and 5). Countersinks and bores 166 and 167 are angularly spaced apart about the center of lid 32 at approximately 120° intervals. An elevational control set screw 168 is disposed in each bore 167, each set screw having a bottom rounded end 171 for engaging frame top surface 152 and an opposite top end 172 provided with an Allen socket 173 therein. Elevation control screws 168 extend through lid bottom surface 33 and are threadedly adjusted within threaded bores 167 so that pattern interconnect 57 and bottom ends 53 and 73 of contact pins 51 and 71 mounted thereto are generally parallel to frame top surface 152 and at the desired elevation with respect thereto. Once elevation screws 168 are so adjusted, epoxy 176 is disposed in Allen sockets 173 and countersinks 166 so as to preclude further adjustment of the set screws.

Lead means or connectors 181 connected to contact pins 51 and making electrical contact with lead strips 101 are included within fixtures 21 and include temporary jumper connections 62 which extend through polymer 56 and have a first end portion making contact with contact pins 51 and a second end portion making contact with second contact pins 71. Lead connectors 181 further include two sets of spaced-apart spring connectors 182 made of gold-plated copper or any other suitable material (See FIGS. 3 and 6). Spring connectors 182 are each generally S-shaped in configuration and have a first or top looped portion 183 and a second or bottom looped portion 186. Spring connectors 182 of each set are disposed and interconnected by an insulator retention or spacer bar 187 made of any suitable materials such as a glass rod coated with polymer. Bar or separator 187 is bonded within top looped portion 183 of each spring connector 182.

One set of spring connectors 182 is mounted to each well platform 107. Bottom looped portion 186 of each spring connector 182 is ultrasonically bonded to a bond pad 108 on platform 107 and further secured to housing 92 by epoxy 188 disposed across bottom looped portions 186, bond pads 108 and platform 107. As disposed within socket 102, spring connectors 182 are aligned in spaced-apart position across each platform 107 by retention bar 187 which serves to, among other things, retain top looped portions 183 in the desired spaced-apart and aligned position. Spring connectors 182 are elevationally yielded after attachment to housing 92 so that top looped portions 183 make electrical contact with the appropriate second contact pin 71 when lid 32 is placed on package 91 and secured thereto.

A clamp element or spring clip 191 is coupled to chip package 91 and lid 32 and is included within engagement assembly 90. Clamp element 191 is made of any suitable material such as stainless steel and is generally U-shaped in configuration, being formed with first or top and second or bottom clamping portions 192 and 193 (See FIGS. 1 and 2). Top clamping portion 192 is provided with a centered dimple 196 near the end thereof which cooperatively seats and rests within a centered registration recess 197 formed in the center of lid top surface 34. Top clamping portion 192 is further formed with an inclined portion 198 which is generally disposed within a ramp 201 provided adjacent lid first end 37 and formed by a ramp surface 202 and opposed inner end surfaces 203.

If power must be supplied to die 22 during burn-in tests, a power supply 206 can be connected to one or more lead strips 101 as illustrated in FIG. 1.

In operation and use, fixture 21 allows for a method of testing the integrated circuit on die 22 in chip package 91. The method steps include placing die 22 in direct electrical contact with lead strips 101 of package 91 without forming a permanent connection, such as those established by wire bonding or soldering, to wire bond pads 27. As discussed above, contact pins 51 are arranged in a pattern formed by pattern interconnect 57 which corresponds to the predetermined pattern in which wire bond pads 27 are arranged on die top surface 23. Pattern interconnect 57 is positioned and aligned on lid bottom surface 33 by registration pins 46 which extend from the lid through first and second alignment bores 76 and 77 provided in the pattern interconnect. Registration pins 46 similarly serve to position and align contact elements 51 with respect to frame 51 by being cooperatively received by frame registration bores 163.

Die 22 is temporarily placed or mounted to spring platform 126 on chip package 91 as discussed above by the thin tacky layer 143 of liquid or polymer. Die 22 can be properly positioned and aligned upon platform 126 by any suitable means such as a pattern recognition system or machine which, after observing the relationship of contact pins 51 with respect to registration pins 46 on lid 32, positions and aligns die 22 on spring platform 126 so that wire bond pads 27 are in a similar relationship with respect to registration bores 163 provided in frame 151.

After die 22 is so placed on chip package 91, lid 32 is mounted to the top of the chip package by disposing lid registration pins 46 in frame registration bores 163. As so aligned, contact pins 51 can be aligned with respective wire bond pads 27 within a tolerance of approximately 0.0002 inches within true position on radius. Outer bores 68, with contact pins 71 therein, are arranged in a pattern on pattern interconnect 57 with respect to alignment bores 76 and 77 and registration pins 46 and frame 151, with registration bores 163 therein, is positioned upon housing top surface 96, so that second contact pins 71 are aligned with top looped portions 183 of spring connectors 182 when lid 32 is so mounted on chip package 91.

Lid 32 is temporarily secured to chip package 91 by clamp 191 as illustrated in FIG. 1. Clamp 191 is slidably disposed about lid 32 and chip package 91, as illustrated in FIG. 2, to urge lid 32 against chip package 91. More specifically, bottom clamping portion 193 engages housing bottom surface 97, sliding between lead strips 101 extending along each side 98 thereof without contacting the lead strips. Clamp dimple 196 engages lid ramp 201 which serves to spread clamping portions 192 and 193 sufficiently apart so as to permit dimple 196 to slide across lid top surface 133 and seat within recess 197 therein. Clamp inclined portion 198 generally seats between opposed inner end surfaces 203 of the ramp, lid surfaces 203 together with centered dimple 196 serving to limit lateral movement of lid 32 with respect to chip package 91 and to thereby prevent short circuits due to clamp 191 engaging one or more lead strips 101.

Set screws 168 elevationally position lid 32 with respect to frame 151 and die 22 mounted on spring platform 126 so that spring platform 126 urges die 22 against cover assembly 31 and each contact pin 51 makes a controlled pressure contact with its respective wife bond pad 27. A pressure contact is also made between each second contact pin 71 and its respective spring connector 182. No permanent connection is made between first or second contact pins 51 and 71 and respective wire bond pads 27 and spring connectors 182. A substantially equal controlled force or pressure of approximately two to four grams is exerted by pin bottom ends 53 on wire bond pads 27 and by pin bottom ends 73 on top portions 183 of spring connectors 182. The amount of this controlled pressure contact is determined by the metal geometry and spring rate of spring platform 126 and spring connectors 182 as well as the elevational positioning of lid 32 by set screws 168. Elevation control screws 168 and registration pins 46 are longitudinally sized and positioned within lid 32 so that the registration pins do not extend through frame registration bores 163 into countersinks 162, thereby engaging any a solder 161 disposed therein, when lid 32 is mounted to chip package 91.

Mounting assembly 116 permits some longitudinal deflection of contact pins 51 and 71 to accommodate irregularities in the elevations of wire bond pads 27 and/or the elevational alignment of lid 32 with respect to frame 151 and/or deflections of die 22. Polymer 56 permits bottom ends 53 of contact pins 51 to exert a controlled pressure contact of approximately two to four grams on each wire bond pad 27 despite such irregularities. In this regard, yieldable polymer 56 disposed between pattern interconnect top surface 58 and lid bottom surface 33 at least partially encapsulates contact pins 51 and 71 and, more specifically, encapsulates respective top ends 52 and 72 thereof. The modulus of elasticity of polymer 56 is chosen so that when lid 32 is mounted to chip package 91 in the manner discussed above and contact pins 51 and 71 engage respective wire bond pads 27 and spring connectors 182, the desired pressure of approximately two to four grams is exerted by polymer 56 on the top ends of contact pins 51 and 71 and temporary jumper connections 62 therebetween. The compressive strength of polymer 56 can range from 400 to 5,000 psi, and preferably equal approximately 1,000 psi. Bottom ends 53 of contact pins 51 can move longitudinally up to 0.0005 inches to accommodate the elevational irregularities of wire bond pads 27.

Bottom ends 43 of contact pins 51 have a proper configuration for providing electrical contact with a contact resistance of less than ten ohms, preferably less than one ohm, when a contact pressure of approximately two to four grams is exerted between the contact pins and wire bond pads 27. For example, contact pins 51 shown in FIGS. 8 and 9 have a relatively rounded or domed bottom end 43 suitable for establishing electrical contact with a wire bond pad 27 made from gold. A contact pin suitable for establishing electrical contact with a wire bond pad 27 made from aluminum, and having 20 an aluminum oxide layer formed thereon, would have a relatively sharp or pointed bottom end.

Jumper connections 62, each severed from pattern interconnect 57 in the manner discussed above so that they can each move independently therefrom and from each other, enhance the ability of mounting assembly 116 to accommodate irregularities in the elevations of wire bond pads 27. Each jumper connection 62 can move individually within polymer 56 without moving or affecting the alignment of the other jumper connections and contact elements 51 on lid 32. In this manner, contact pins 51 are independently supported in polymer 56 in an elastic and hydraulic fashion against the longitudinal loads exerted on the contact pins by wire bond pads 27, and leveling differences do not aggregate excessive wire bond pad or overall die loads. Contact pins 71 are similarly independently supported by polymer 56.

The method step of conducting burn-in tests on die 22 and the integrated circuit therein while wire bond pads 27 are in direct electrical contact with lead strips 101 is facilitated by fixture 21. Among other things, chip package 91 of fixture 21 has lead pins or strips and sockets in a configuration compatible with standard test, burn-in, handling and transferring equipment used for testing, burning-in and handling conventional chip packages having integrated circuit die mounted therein and already installed in the customer's facility. During the burn-in tests, the integrated circuit in die 22 can be electrically exercised and tested to ascertain whether predetermined electrical parameters are met. As discussed above, the burn-in tests can include subjecting die 22 to a range of temperatures, both above, below and at normal ambient temperature, shock forces, biasing, continuity checks, voltage signal cycling, power surges and high-current thermal shock. During burn-in tests, the pressure applied by contact pins 51 of fixture 21 bond pads 22 of die 22 remains substantially constant.

Following burn-in tests, wire bond pads 27 are harmlessly disconnected from package lead strips 101 by simply removing clamp 191 and lid 32 to permit retrieval and removal of die 22 from spring platform 126. If the integrated circuit on die 22 has been found to be acceptable, die 22 can then be easily mounted to a suitable first or second tier package for shipment or use. Because no permanent electrical connection was made to wire bond pads 27 during burn-in tests, wire bond pads 27 are in a condition suitable to permit solder, wire bonding or other types of permanent connections to be made thereto. If the integrated circuit of die 22 has failed in some respect during burn-in tests, the die can be discarded. The pressure contact exerted by contact pins 51 on wire bond pads 27 during testing leaves a small witness mark on each wire bond pad 27 which can be seen through the magnification of a microscope and evidences that die 22 has undergone testing and/or burn-in.

It should be appreciated that the fixture of the present invention can be configured to test integrated circuit die having wire bond pads arranged in other patterns and be within the scope of the present invention. For example, a fixture similar to fixture 21 could be designed for testing integrated circuit die having two rows of wire bond pads down the middle thereof. The housing of chip package 91 can also be made of other suitable materials which meet the needs of the user and be within the scope of the present invention. For example, a plastic housing can be acceptable if operation of the chip at extreme temperatures is not required. In chip packages with plastic housings, the lead interconnect assembly includes a lead frame molded or encapsulated into the housing, leads or pins for permitting electrical access to the integrated circuit in the package and bond pads for permitting electrical access from the package to the integrated circuit die mounted therein.

A fixture for testing an integrated circuit die in a package having leads can have other configurations and be within the scope of the present invention. For example, another embodiment is illustrated in FIGS. 10 through 12 where a fixture 216 for making temporary electrical connections with an integrated circuit die or chip 217 to permit electrical testing of the integrated circuit of the die is shown. Chip 217 is a conventional flip chip made of silicon and having opposite and generally planar top and bottom surfaces 218 and 221. Top surface 218 has a plurality of interconnect pads or solder bumps 222 arranged in a predetermined pattern along each side thereof which permit making electrical connections with the integrated circuit of chip 217. Solder bumps 222 typically vary in elevational height with respect to top surface 218 from 0.001 to 0.002 inches in a die lot.

Fixture 216 is provided with a cover or electrical bridge apparatus or assembly 226 which overlies chip 217 and includes a substantially rigid support member or lid 227 made of any suitable material such as alloy 42 metal. Lid is generally in the form of a parallelepiped having generally square opposite first or bottom and second or top surfaces 228 and 230, opposite first and second sides 231 and opposite first and second ends 232. Two diagonally disposed bores 233 extend generally perpendicularly through surfaces 228 and 230 in two opposite corners formed by an adjacent side 231 and end 232 and have elongate registration means or pins 236, substantially similar to registration pins 46, press fit or otherwise snugly disposed permanently therein. Registration pins 236 are generally flush with lid top surface 230 and extend from lid bottom surface 228 as illustrated in FIG. 12.

Elongate contact elements or pins 241 made of solid gold or any other suitable material are carried by lid bottom surface 228 and are adapted to engage solder bumps 222 for making electrical connections to the integrated circuit of chip 217. Pins 241 are generally circular in cross-section, having a butt first or top end 242 and a rounded second or bottom end 243. Means for mounting pins 241 to lid 227 includes a flat plate member 246 carried by lid 227 in juxtaposition therewith and a layer of polymer 247 sandwiched therebetween.

Plate 246 is made of any suitable material having a thermal coefficient of expansion which approximates the thermal coefficient of expansion of chip 217. Ideally, the plate should be made from the same material as chip 217, in this case silicon. Plate 246 is generally in the form of a parallelepiped having generally square opposite first or bottom and second or top surfaces 248 and 250. Adhesive polymer 247 is made of any suitable material such as silicone and serves as a flexible or yieldable material or controlled jelly. The layer of polymer 247 disposed between lid bottom surface 228 and plate top surface 250 serves as means for attaching plate 246 to lid 227.

Plate 246 has a center 253 and is provided with a set of first or inner bores 254 and second or outer bores 256 extending generally perpendicularly through surfaces 248 and 250. Inner bores 254 are closer to plate center 253 than outer bores 256 and are formed in a pattern on bottom surface 248 generally corresponding to the predetermined pattern of solder bumps 222 on chip 217. Contact pins 241 are slidably disposed in inner bores 254 and are longitudinally sized so that top ends 242 extend a distance above plate top surface 250 while bottom ends 243 extend a substantially equal distance below plate bottom surface 248. A second set of elongate contact elements or pins 257, substantially similar to contact pins 241 and having butt first or top ends 258 and rounded second or bottom ends 261, are disposed in outer bores 256. Contact pins 257 are also longitudinally sized so that top ends 258 extend above plate top surface 250 a distance and bottom ends 261 extend below plate surface 248 a substantially equal distance.

Electrical connector means are included in cover assembly 226 for connecting contact pins 241 and 257 and include a plurality of thin film interconnects or lines 262 made from gold, copper or any other suitable conductive material. Lines 262 are formed on plate top surface 250 by any suitable means such as lithography, chemical etching or vapor deposition and have bond pads 263 at each end thereof. Polymer 247 covers the tops and sides of conductive lines 262 and, in this manner, the lines extend through polymer 247 between related contact pins 241 and 257. Wires 264 extend from bond pads 263 through polymer 247 to the related contact pin 241 or 257, and are attached by any suitable means such as wire bonding at one end to bond pad 263 and at the other end to top end 242 of a contact pin 241 or top end 258 of a contact pin 257.

Contact pins 241 and 257 are slidably disposed in respective plate bores 254 and 256 to permit longitudinal movement thereof with respect to lid 227 and plate 246 during burn-in tests. Top ends 242 and 258 engage polymer 247, with the polymer covering the ends so as to at least partially encapsulate contact pins 241 and 257. Wires 262 are sized to permit longitudinal movement of contacts in 241 and 257, and lid bottom surface 228 is provided with a plurality of load compensation grooves 265 therein to accommodate polymer 247 displaced by longitudinal movement of the contact pins. Grooves 265 are formed in lid 227 and are not filled with polymer 247 during the assembly of cover assembly 226.

Registration retention means is provided in cover assembly 226 for retaining contact elements 241 in registration with solder bumps 222 should chip 217 expand during thermal burn-in testing. In this regard, fixture 216 is provided with at least three elongate retention or center reference pins 271 which extend from lid bottom surface 228 and are made from any suitable material such as alloy 42 metal. Lid 227 is provided with six retention bores 272 extending through lid surfaces 228 and 230, and six pins 271 are press fit or otherwise snugly disposed within bores 272. Lid 227 has a center 273 and pins and bores 271 and 272 are spaced circumferentially thereabout at equal angles and are substantially equidistant therefrom. Six center reference pins and bores 271 and 272 shown in the drawings are spaced circumferentially apart at an angle of approximately 60°.

Plate 246 is provided with a guide slot 277 extending through surfaces 248 and 250 and radially from plate center 253 for each center reference pin 271 carried by lid 227. Slots 277 are spaced circumferentially about plate center 253 at an angle of approximately 60°. Each slot 277 has an end 278, with slot ends 278 being substantially equidistant from plate center 253. Center reference pins 271 are disposed in guide slots 277 a substantial equal distance from slot end 278 to permit thermal expansion of plate 246 without pin 271 engaging slot end 278.

Engagement means or assembly 286 is provided for bringing solder bumps 222 and contact pins 241 together into engagement and registration to make nonpermanent temporary simultaneous electrical connections therebetween. Engagement assembly 286 includes a conventional integrated circuit package, such as a pin grid array package 287 shown in FIGS. 10 through 12, for receiving chip 217. Package 287 is formed from a housing 288 made from a suitable non-conductive material such as ceramic and includes an internal conductive lead interconnect assembly 291 carried within and by housing 288 to permit making electrical contact with a chip or die mounted in the package. Housing 288 is in the form of a parallelepiped, having opposite generally square first or top and second or bottom surfaces 292 and 293. Lead interconnect assembly 291 includes a plurality of generally parallel pins 297 extending from housing bottom surface 293 to permit making electrical connections with chip package 287. Pins 297, which can exceed 300 in number, are aligned in a pattern of rows and columns or in a specific array across bottom surface 293.

Housing 288 further includes a recess or well 301 provided in the center of top surface 292. A layer of vapor deposited gold, included within lead interconnect. assembly 291 and substantially similar to gold layer 158, has a surface which forms lower surface 303 of well 301 and the floor of chip package 287. A continuous integral platform 306 is formed in housing 288 around the perimeter of well lower surface or package floor 303 and below top surface 292, each side of platform 306 having a plurality of contact elements or bond pads 307 linearly spaced apart therealong. Each bond pad 307 is formed from a strip of gold vapor deposited onto platform 306 of ceramic housing 288 and is electrically connected to a lead assembly pin 297.

Engagement assembly 286 has a mounting assembly 311 for temporarily and nonpermanently mounting chip 217 within well 301 which comprises a button 312 illustrated, not necessarily to scale, in FIG. 12. Button 312 is made of any suitable material such as gold-plated copper and has a base portion 312a ultrasonically bonded to package floor 303. Button 312 is further secured to package floor 303 by epoxy 313, and is provided with a plurality of bores 316 spaced circumferentially around base portion 312a thereof for increasing the surface area of button 312 and gold layer 302 interconnected by the epoxy. Button 312 has an upstanding portion 312b provided with a centrally disposed opening 317 extending longitudinally therethrough and sides which are convex when viewed in cross-section.

A support structure or spring platform 321 for supporting chip 217 on package 287 and made from a suitable material such as alloy 42 metal is also included within mounting assembly 311. Yieldable quad spring platform 321 is generally square when viewed in plan and is configured as a cruciform with four generally triangular-shaped arms extending outwardly and upwardly from the center thereof. Each arm 322 has an elevated rectangular shaped pad 323 at the end thereof. Pads 323 have top surfaces 326 which are generally coplanar with each other. Platform 321 is provided with an opening 327 in the center thereof and has an outwardly protruding annular rim 328 at the bottom center thereof which is shown in cross-section in FIG. 12.

Spring platform 321 is mounted to button 312 in a manner similar to the manner in which spring platform 126 is mounted to button 117. The central portion of spring platform 321 is placed on button upstanding portion 312b with rim 328 extending downwardly inside button portion 312b. A suitable quick-drying cyanoacrylate polymer or anaerobic cement substantially similar to cement 133 is disposed on button upstanding portion 312b for initially attaching spring platform 306 thereto. Epoxy 332 is disposed inside button 312 and spring platform opening 327 and serves to more permanently and securely attach the spring platform to the button. Platform rim 328 grips epoxy 332 to restrict separation of spring platform 321 from button 312 and epoxy 332.

Chip 217 is mounted on platform 321 with chip bottom surface 221 being supported around the periphery thereof by platform pads 323. A suitable adhesive such as a thin tacky layer 333 of any suitable liquid or polymer such as silicone, oil or water is placed on pad top surfaces 323 and temporarily grips chip bottom surface 221 to restrict lateral movement between chip 217 and platform 321 until bottom ends 243 of contact pins 241 engage solder bumps 222 of chip 217. Platform pads 323 are provided with pad bores 336 extending therethrough and spaced thereacross to further limit such lateral movement.

A frame 341 made of a suitable material such as alloy 42 metal is mounted to housing top surface 292 and is included in the means for positioning and aligning cover assembly 226 on chip package 287. Frame 341 is generally square when viewed in plan, having opposite and generally parallel first or top and second or bottom surfaces 342 and 343 and provided with a central square opening 346 therethrough. Frame 341 is attached to package 287 in a manner similar to the manner in which frame 151 is attached to package 91. More specifically, housing top surface 292 is provided with a layer 347 of vapor deposited gold around the perimeter of well 301 and frame bottom surface 343 is attached to gold layer 347 by any suitable means such as gold tin solder 348. Frame 341 is further provided with two countersinks 351 and registration bores 352 substantially similar to countersinks 162 and registration bores 163 of fixture 21. Registration bores 352 are aligned on frame 341 in a pattern corresponding to the pattern of registration pins 236 on lid bottom surface 228, and registration pins and bores 236 and 352 are included within the means for aligning lid 227 with frame 341 and chip package 287.

Engagement assembly 286 also includes means for leveling and elevationally positioning lid 227 with respect to frame 341 and chip package 287. In this regard, lid 227 is provided with three countersinks and threaded bores 356 and 357 substantially similar to countersinks 166 and bores 167 and angularly spaced apart about lid center 273 at approximately 120° intervals. An elevation control set screw 358 is disposed in each bore 357 and has a bottom rounded end 361 and an opposite top end 362 provided with an Allen socket 363 therein. Set screw 358 operates substantially similar to elevation control screws 168 of fixture 21 in leveling and elevationally positioning lid bottom surface 228 to frame top surface 342. Once elevation control screws 358 are adjusted, epoxy 366 is disposed in Allen sockets 363 and countersinks 356 so as to preclude further adjustment.

Lead means or connectors 371 connected to contact pins 241 and making electrical contact with package pins 297 are included within fixture 216 and include thin film interconnects 262 and wires 264. Lead connectors 371 further include an elevation contact assembly 372 mounted on each side of well platform 306. Each elevation contact assembly 372 is a laminate formed from a plurality of linearly spaced-apart conductive coupons 373 bonded together by epoxy 376. Coupons 373 are spaced apart and sized so that one coupon is mounted on each package bond pad 307, with respective coupons 373 and bond pads 307 being attached by any suitable means such as a layer of gold tin solder 377 disposed therebetween. Coupons 373 are elevationally sized so that contact pins 257 make contact therewith when cover assembly 226 is mounted to chip package 287 and contact pins 241 make contact with solder bumps 222.

A clamp element or spring 381 is coupled to chip package 287 and lid 227 and is included within engagement assembly 286. Hold down clamp element 381 is made of any suitable material such as stainless steel and is generally U-shaped in configuration, being formed with a generally arcuate top portion 382 having a generally planar center engagement portion 383 and two generally parallel arm portions 386 extending in the same direction at opposite ends of top portion 382. Clamp arm portions 386 extend through generally parallel thin slots 387 provided in the center of frame 341 along two opposite sides thereof and have ridges 388 at the end thereof for securing clamp 381 within slots 387.

A flexible seal 391 made of any suitable elastomeric material such as molded polymer or silicone rubber is circumferentially disposed between lid bottom surface 228 and frame top surface 342 and serves as means for hermetically sealing chip 217 within fixture 216 during burn-in tests. Seal 391 is seated in a recess 392 formed around the outer portion of lid bottom surface 228 and adjacent sides 231 and ends 232.

If power must be supplied to chip 217 during burn-in tests, a power supply 393 can be connected to one or more pins 297 as illustrated in FIG. 10.

The operation and use of fixture 216 will now be briefly described. The method of testing in fixture 216 the integrated circuit of chip 217 is substantially similar to the method of testing discussed above with respect to fixture 21, and includes placing chip 217 in direct electrical contact with pins 297 of package 287 without forming a permanent connection, such as those established by soldering, to solder bumps 222. Chip 217 can be properly positioned and aligned upon spring platform 321 with a pattern recognition system or machine which, as discussed above, positions and aligns chip 217 on spring platform 321 so that the spacial relationship of chip solder bumps 222 to frame registration bores 352 is the same as the spacial relationship of contacts pins 241 carried by lid 227 and plate 246 is to registration pins 236 carried by lid 227. As such, contact pins 241 are aligned with solder bumps 227 within a planar tolerance of approximately 0.001 inches when cover assembly 226 is placed over chip package 287. Lid 227 is removably mounted to package 287 during burn-in testing, with seal 391 providing a nonpermanent seal between the lid and the package.

Fixture 216 permits substantial simultaneous engagement between bottom ends 243 of contact pins 241 and solder bumps 222 when cover assembly 226 is mounted and secured to chip package 287. In this regard, pad top surfaces 326 of spring platform 321 and frame top surface 342 are substantially parallel to package floor 303, and plate 246 is mounted to lid 227 and cover assembly 226 is elevationally positioned with respect to frame top surface 342 so that plate bottom surface 248 is substantially parallel to pad top surfaces 326. Spring platform 321 urges solder bumps 222 into engagement with contact pins 241 when cover assembly 226 is mounted and secured to chip package 287.

Plate outer bores 256 with contact pins 257 therein are arranged on cover assembly 226 with respect to registration pins 236, and frame 341 with registration bores 352 therein is positioned upon housing top surface 292, so that second contact pins 257 are aligned with coupons 373 of elevation contact assembly 372 when cover assembly 226 is mounted to chip package 287. Coupons 373 and contact pins 257 are sized so that contact pins 257 engage coupons 373 simultaneous with contact pins 241 engaging solder bumps 222.

No permanent connection, such as a permanent connection made by wire bonding or soldering, is made between contact pins 241 and 257 and respective solder bumps 222 and coupons 373. Instead, solder bumps 222 are electrically connected to package pins 297 through controlled pressure contacts between contact pins 241 and solder bumps 222 and between contact pins 257 and coupons 373.

The assembly of contact pins 241, plate 246 with inner bores 254 therein and polymer 247 sandwiched between plate 246 and lid 227 permits contact pins 241 to accommodate irregularities in the elevations of solder bumps 222 above chip top surface 218. As discussed above, contact pins 241 are slidably disposed in inner bores 254 and can independently move longitudinally with respect to plate 246 to accommodate such elevational irregularities of solder bumps 222. Bottom ends 243 thereof can move longitudinally up to 0.005 inches to accommodate the elevational irregularities of solder bumps 222. Polymer 247 encapsulates top ends 242 of contact pins 241 and has a compressive strength ranging from 400 to 5,000 psi so as to exert a constant pressure of approximately two to four grams on top ends 242 regardless of the longitudinal position tolerance range of contact pins 241 with respect to plate bottom and top surfaces 248 and 250. As a result, a substantially equal force or pressure of approximately two to four grams is applied by contact pins 241 to solder bumps 222, and this pressure remains substantially constant during burn-in tests.

Once pin bottom ends 243 and 261 engage respective solder bumps 222 and coupons 373 to form a pressure contact thereon, the compressive strength of polymer 247 provides a substantially equal reactive force or load on pin top ends 242 and 258 such that all pins 241 and 257 have essentially the same longitudinal load thereon. Load compensation grooves 265 formed in lid bottom surface 228 permit polymer 247 to flow therein when the polymer mass is displaced by the upward longitudinal movement of contact pins 241. In this manner, grooves 265 limit any transverse loads imparted on other contact pins 241 and/or 257 by upward longitudinal movement of a contact pin 241. Grooves 265 are formed in lid 227 in the vicinity of bores 254, preferably opposite thereof.

During burn-in tests which involve electrically exercising the integrated circuit of chip 217 at elevated temperatures, fixture 216 maintains contact elements 241 in registration and alignment with solder bumps 222 so as to maintain electrical contact between the integrated circuit of chip 217 and pins 297 of package 287. As discussed above, plate 246 is made of a material having a thermal coefficient of expansion which approximates the thermal coefficient of expansion of chip 217.

Accordingly, should chip 217 undergo thermal expansion or contraction due to the exposure of fixture 216 and chip 217 to temperature extremes above or below ambient temperature, plate 246 will likewise expand or contract. Flexible polymer 247 permits plate 246 to expand or contract with respect to lid 227. Center reference pins 271 carried by lid 227 and disposed in radially extending guide slots 277 in plate 246 serve to guide plate 246 during any such expansion or contraction thereof and retain plate center 253 in alignment with lid center 273. In this manner, contact pins 241 remain in registration and alignment with solder bumps 222 of expanding or contracting chip 217.

After the completion of the necessary burn-in tests, clamp 381 and cover assembly 226 are removed from package 287, thereby electrically disconnecting solder bumps 222 from package pins 297, and chip 217 is removed from the package. Since no permanent connection has been made to solder bumps 222, the known good die can be mounted to second tier packages and utilized. Chips 217 which fail burn-in tests can be discarded without the loss of a related second tier package and the cost of mounting chip 217 thereto.

Fixtures 21 and 216 can be utilized for testing integrated circuit die having other types of interconnect pads and be within the scope of the present invention. For example, integrated circuit die having conventional bond pads can be tested in fixture 216. In this regard, a cover assembly such as cover assembly 226 is particularly beneficial for testing chips or dies, such as those typically mounted in pin grid array packages, having relatively large surface areas with a significant number of bond pads thereon or thereacross. As can be appreciated, maintaining the required elevational tolerances between the wire bond pads and respective contact pins over such a relatively large area can be difficult. Discrepancies in these elevational tolerances can be accommodated by cover assembly 216 which permits longitudinal movement of contact pins 241 and maintains a substantially constant pressure on each contact pin carried thereby.

It should be appreciated that aspects of fixtures 21 and 216 can be interchanged with each other or utilized with other chip packages and remain within the scope of the present invention. For example, fixture 21 can include a cover assembly similar to cover assembly 226 for burn-in testing of flip chips therein.

It is apparent from the foregoing that a new and improved method for testing a nonpackaged die and an apparatus for the same has been provided. A method is disclosed for performing burn-in tests on a nonpackaged die which utilizes, for the most part, conventional and available testers, handlers and materials. The damage-free method does not require that a permanent connection be formed with the interconnect pads of the die, and can be used for testing an integrated circuit die having 20 to 1,000 or more interconnect pads disposed thereon and for testing flip chips having interconnect pads which include solder bumps. A fixture is provided for use with the described method which utilizes a conventional or industry standard package assembly having the usual envelope and commercial standard electrical access and is compatible with commercial test, burn-in and handling equipment for conventional integrated circuit packages. The fixture permits a controlled low pressure contact to be made independently with each interconnect pad when establishing electrical contact therewith. The pressure exerted on each interconnect pad is substantially equal and not deleterious to the integrated circuit die or subsequent interconnection operations, but leaves a small witness mark on the interconnect pad as evidence that the die has undergone testing and/or burn-in. Electrical contact with interconnect pads is maintained should the die expand during thermal testing.

The foregoing descriptions of the specific embodiments of the present invention have been presented for purposes of illustration and description. They are not intended to be exhaustive or to limit the invention to the precise forms disclosed, as many modifications and variations are possible in light of the above teaching. The embodiments were chosen and described in order to best explain the principles of the invention and its practical application, and to thereby enable others skilled in the art to best utilize the invention and various embodiments with various modifications as are suited to the particular use contemplated. It is intended that the scope of the invention be defined by the claims appended hereto and their equivalents.

What is claimed is:

1. A fixture for making temporary electrical connections with an integrated circuit die to permit electrical testing of various parameters of the circuitry of the integrated circuit, the die having interconnect pads arranged in a predetermined pattern, comprising a substantially rigid support member having a surface, a layer of elastomeric material carried by the surface of the support member, a plate member carried by the layer of elastomeric material and spaced apart from the support member, the plate member having opposite first and second surfaces and provided with a plurality of bores extending through the first and second surfaces and forming a pattern on the second surface generally corresponding to the predetermined pattern of interconnect pads, a longitudinally extending contact element having first and second end portions slidably disposed in each of the plurality of bores, engagement means adapted for bringing the contact elements into registration and engagement with the interconnect pads to make nonpermanent temporary electrical connections therebetween, the engagement means including a package adapted to carry the die and having leads which permit making electrical connections with the package and are in a configuration compatible with test, burn-in and handling equipment for conventional integrated circuit packages, the layer of elastomeric material urging the second end portion of each contact element against an interconnect pad and permitting individual movement of each contact element for facilitating engagement of respective contact elements and interconnect pads and lead means carried by the engagement means and secured to the first end portions of the contact elements for electrically connecting the contact elements with the leads of the package.

2. A fixture as in claim 1 wherein the lead means includes a strip element connected to each contact element.

3. A fixture as in claim 1 wherein the plate member has a thermal coefficient of expansion which approximates the thermal coefficient of expansion of the integrated circuit die.

4. A fixture as in claim 1 wherein the elastromeric material at least partially encapsulates the first end portions of the contact elements.

5. A fixture as in claim 1 wherein the engagement means includes a clamp element mounted on the package for urging the support member against the package.

6. A fixture as in claim 1 further comprising seal means circumferentially disposed between the support member and the package.

7. A fixture as in claim 1 further comprising means for applying power to certain of the contact elements while testing electrical parameters of the integrated circuit of the die.

8. A fixture as in claim 1 wherein the first end portions are cylindrical in shape and free of enlarged heads.

9. A fixture as in claim 1 wherein the elastomeric material is silicone.

10. An apparatus for making a temporary electrical connection with an integrated circuit die having interconnect pads, comprising a support member having a surface, an elastomeric material disposed on the surface of the support member, a plurality of substantially rigid contact elements, a plate member spaced apart from the support member and attached to the elastomeric material, the plate member having opposite first and second surfaces and provided with a plurality of bores extending through the first and second surfaces for slidably receiving the contact elements and engagement means adapted for carrying the die and for bringing the contact elements into registration and engagement with the interconnect pads to make nonpermanent temporary electrical connections therebetween, the elastomeric material urging each contact element against an interconnect pad and permitting individual movement of each contact element to facilitate engagement of the contact elements and interconnect pads and provide a substantially uniform contact load between the contact elements and interconnect pads.

11. An apparatus as in claim 10 wherein the surface of the support member is provided with a recess therein for accommodating elastomeric material displaced by the movement of the contact elements into the elastomeric material upon the engagement of the contact elements with the interconnect pads.

12. An apparatus as in claim 10 wherein the plate member has a thermal coefficient of expansion which approximates the thermal coefficient of expansion of the integrated circuit die.

13. An apparatus as in claim 12 wherein the plate member has a center, together with registration retention means carried by the engagement means and the plate member which includes at least three slots extending radially from the center of the plate member and spaced apart circumferentially thereabout and at least three pins carried by the engagement means and disposed in the slots.

14. An apparatus as in claim 13 wherein the slots are substantially equivalently spaced from the center of the plate and substantially equivalently spaced circumferentially thereabout.

15. An apparatus as in claim 10 further comprising registration retention means carried by the support member and the plate member for retaining the contact elements in registration with the interconnect pads should the die expand during thermal testing.

16. An apparatus as in claim 10 further comprising electrical connector means carried by the elastomeric material and connected to the contact elements.

17. An apparatus as in claim 10 wherein the engagement means includes a package for carrying the die and having leads which permit making electrical connections with the package and are in a configuration compatible with test, burn-in and handling equipment for integrated circuit packages, lead means carried by the support member and the package for electrically connecting the contact elements with the leads of the package.

18. An apparatus as in claim 10 wherein the contact elements are made from a conductive metal.

19. An apparatus as in claim 10, wherein the elastomeric material is silicone.

* * * * *